US 6,573,604 B1

(12) United States Patent
Kajita

(10) Patent No.: US 6,573,604 B1
(45) Date of Patent: Jun. 3, 2003

(54) SEMICONDUCTOR DEVICE CARRYING MEMORY AND LOGIC CIRCUIT ON A CHIP AND METHOD OF MANUFACTURING THE SAME

(75) Inventor: Akihiro Kajita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/179,952

(22) Filed: Jun. 26, 2002

(30) Foreign Application Priority Data

Apr. 26, 2002 (JP) ....................... 2002-127353

(51) Int. Cl.[7] ................ H01L 23/52; H01L 23/40
(52) U.S. Cl. ................ 257/758; 257/750; 257/751; 257/774; 257/775; 257/762
(58) Field of Search ................ 257/758, 750, 257/751, 774, 775, 762

(56) References Cited

U.S. PATENT DOCUMENTS 5,719,079 A * 2/1998 Yoo et al. .................. 438/238
6,025,267 A * 2/2000 Pey et al. ................... 438/656
6,051,462 A * 4/2000 Ohno ......................... 438/241
6,096,595 A * 8/2000 Huang ........................ 438/238
6,429,521 B1 * 8/2002 Wada et al. ................ 257/758

FOREIGN PATENT DOCUMENTS

| EP | 0543489 A1 | * | 2/1992 | ........... H01L/27/11 |
| JP | 6-268177 | | 9/1994 | |
| JP | 2001-36043 | * | 2/2002 | ......... H01L/27/108 |

OTHER PUBLICATIONS

C. E. Blat, et al. "Mechanism of Negative–Bias–Temperature Instability" J. Appl. Phys. vol. 69, 1991, pp. 1712–1720.

* cited by examiner

Primary Examiner—Jasmine J B Clark
(74) Attorney, Agent, or Firm—Oblon, Spivak, McClelland, Maier & Neustadt, P.C.

(57) ABSTRACT

A semiconductor substrate has a logic region and a memory region. A multilayer wiring layer is formed on the logic region and the memory region. A diffusion preventing film is formed at least between the multilayer wiring layer in the logic region and the element forming layer in the logic region for the purpose of preventing $H_2O$ from diffusing into the logic region.

19 Claims, 9 Drawing Sheets

SEMICONDUCTOR DEVICE CARRYING MEMORY AND LOGIC CIRCUIT ON A CHIP AND METHOD OF MANUFACTURING THE SAME

CROSS-REFERENCE TO RELATED APPLICATIONS

This application is based upon and claims the benefit of priority from the prior Japanese Patent Application No. 2002-127353, filed Apr. 26, 2002, the entire contents of which are incorporated herein by reference.

BACKGROUND OF THE INVENTION

1. Field of the Invention

This invention relates to a semiconductor device comprising at least a memory and a logic circuit merged on a single chip and a method of manufacturing the same.

2. Description of the Related Art

Semiconductor devices including high performance logic devices such as CPUs and high speed SRAMs need to suppress delays of signal propagation so as to be able to operate at high speed. Therefore, it is desirable to use multilayer wiring for such devices in order to reduce the wiring resistance thereof. It is also desirable to use copper (Cu) as wiring material because of the low electric resistance of the metal. Furthermore, a material having a specific dielectric constant (k) lower than $SiO_2$ film needs to be used as insulating film for the purpose of electrically insulating wiring layers from each other.

So called low-k film, for example, MSX (methyl-polysiloxane), HSQ (hydrogen-silsesquioxane) or PAE (poly(arylene)ether) is known as insulating film having a low dielectric constant. Low-k films of this type normally show a specific dielectric constant of k=2.6 to 3.0 and hence is lower than the specific dielectric constant of $SiO_2$ film, of k=3.5 to 4.3. Therefore, low-k film can take a major role in reducing the delay time. So-called porous low-k film has also been developed as the film density of low-k film can be reduced by using a porous material for the low-k film.

Meanwhile, semiconductor devices comprising a high performance logic circuit and a memory such as a DRAM merged on a single chip also require a multilayer wiring arrangement of using Cu wires and a low-k material for the purpose of improving the performance.

However, as a multilayer wiring arrangement is used, the reliability problem of the underlying transistors becomes apparent. Generally, when a CMOS device is held to temperature of about 150° C. while a weak electric field is applied to the gate electrode of the P-channel MOS transistor (PMOS) of the CMOS device, a new level and a fixed positive electric charge are produced along the interface of the gate insulating films and the silicon. Then, it is known that there arises a phenomenon including a change in the threshold voltage of the transistor, which is referred to as NBTI (Negative Bias Temperature Instability) degradation, to deteriorate the long term reliability of the characteristics of the device. C. E. Blat et al., J. Appl. Phys. Vol. 69, p. 1712 (1991) describes a possible cause of the phenomenon. According to the above identified paper, $H_2O$ (gas) that is diffused to get to the flaws formed on the interface of the gate insulating films and the silicon shows a hole catching reaction due to the electric field and the heat there, and consequently produces a new level and a fixed positive electric charge. Therefore, in order to suppress the possible NBTI degradation in the process of forming a device that is sensitive to NBTI degradation, it is necessary to prevent $H_2O$ from diffusing to the element forming layers including the gate insulating films.

Additionally, a so-called $H_2$ sintering treatment of thermally treating a semiconductor device in an $H_2$ gas atmosphere is conducted immediately before the end of the process of manufacturing the device. The $H_2$ sintering treatment is designed to recover the semiconductor device from the charging damages that have been caused by the plasma treatments such as reactive ion etching and plasma CVD conducted in the device manufacturing process. However, the phenomenon of NBTI degradation can occur when $H_2$ gas is excessively introduced into the substrate in the $H_2$ sintering treatment as in the case of the use of $H_2O$.

There is also known a problem that NBTI degradation is accelerated when low-k film is used for multilayer wiring if such undesired gases are diffused into the element forming layers at a high rate. This is because firstly a low-k material discharges $H_2O$ and $H_2$ at a rate higher than $SiO_2$ film during the film forming process and secondly a low-k material shows a high hygroscopicity and hence discharges $H_2O$ generously in the heat treatment process that comes after the low-k film forming process. Therefore, when a low-k material is used for manufacturing a high performance device, it is subjected to a number of restrictions including a material that shows a low $H_2O$ and $H_2$ emission rate has to be selected for the film forming process, and a low upper temperature limit has to be selected for the heat treatment in the multilayer wiring process.

Furthermore, in a semiconductor device comprising a logic circuit and a DRAM merged on a single chip, the reliability of the transistors in the logic region of the device can be deteriorated due to NBTI degradation particularly when $H_2$ is introduced excessively into the substrate. On the other hand, the DRAM region has to be subjected to $H_2$ sintering for a long period of time at high temperature in order to prolong the retention time because the latter significantly influence the data retaining characteristics of the device. In short, the logic region and the DRAM region of the device have respective requirements that are contradictory relative to each other. This means that it is difficult to establish both a high degree of reliability of the transistors in the logic region and excellent data retaining characteristics of the DRAM region. Thus, there is a demand for semiconductor devices that can provide both a high degree of reliability of the transistors in the logic region and excellent data retaining characteristics of the DRAM region and also for a method of manufacturing such devices.

BRIEF SUMMARY OF THE INVENTION

According to an aspect of the invention, there is provided a semiconductor device comprising: a semiconductor substrate; a logic region formed in the semiconductor substrate and including an element forming layer; a memory region formed in the semiconductor substrate and including an element forming layer; a multilayer wiring layer formed above each of the logic region and the memory region; and a diffusion preventing film formed at least between the multilayer wiring layer in the logic region and the element forming layer in the logic region; the diffusion preventing film being adapted to prevent $H_2O$ from diffusing into the logic region.

According to another aspect of the invention, there is provided a method of manufacturing a semiconductor device comprising: forming transistors in a logic region and a memory region of a semiconductor substrate; forming a first insulating film on the logic region and the memory region; forming a diffusion preventing film on the first insulating film in the logic region; the diffusion preventing film preventing $H_2O$ from diffusion; forming a second insulating film on the diffusion preventing film and the memory region; and forming a multilayer wiring layer on the second insulating film.

DETAILED DESCRIPTION OF THE INVENTION

The present invention will be described in greater detail by referring to the accompanying drawing that illustrates embodiments of the invention.

1st Embodiment

Figure 1:
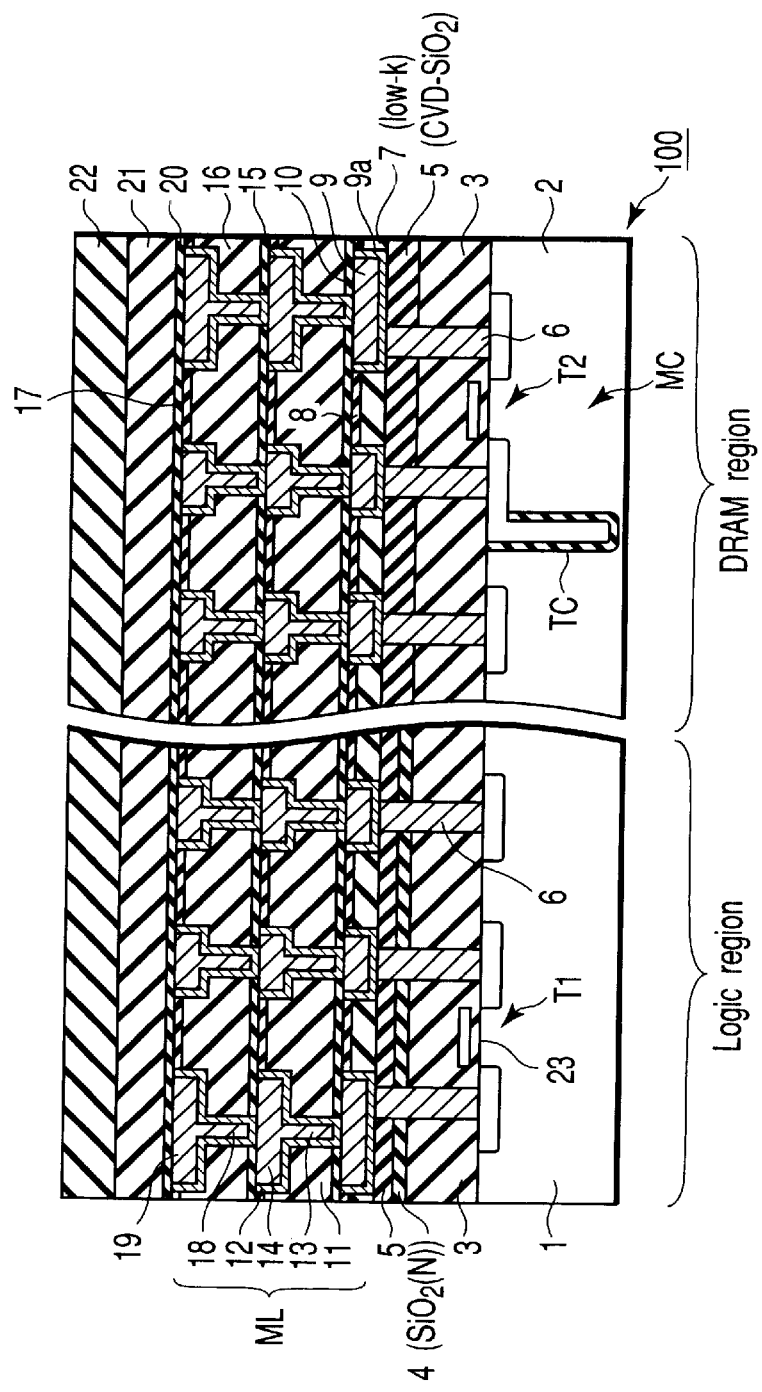
FIG. 1 is a schematic cross sectional view of the first embodiment of the present invention.

FIG. 1 is a schematic cross sectional view of the first embodiment of the semiconductor device according to the present invention.

Referring to FIG. 1, in a semiconductor device comprising a logic circuit and a DRAM merged on a single chip, the insulating film layer arranged immediately under the multilayer wiring layer ML shows a structural difference between the logic region and the DRAM region. More specifically, transistors T1 are formed in the element forming layer 1 of the logic region, while memory cells MC including MOS transistors T2 and trench capacitors TC, for instance, are formed in the element forming layer 2 of the DRAM region. Typically, the element forming layers 1, 2 are produced by using a semiconductor substrate or wells. In the DRAM region, a CVD insulating film 3 that is typically a BPSG or PSG film and shows an excellent covering effect is formed on the element forming layer 2 and then a CVD-$SiO_2$ film 5 is formed on the insulating film 3 as cap film.

In the logic region, on the other hand, a CVD insulating film 3 that is, for example, a BPSG or PSG film is formed on the element forming layer 1 and a CVD-$SiO_2$ film 5 is formed thereon as cap film. Additionally, a diffusion preventing film 4 that is an insulating film is formed between the CVD film 3 and the CVD-$SiO_2$ film 5. The diffusion preventing film 4 provides an effect of preventing $H_2O$ from diffusion. More specifically, the diffusion preventing film 4 prevents $H_2O$ generated in the multilayer wiring process using low-k film from diffusing into the gate insulating films that are arranged on the element forming layer 1 and highly sensitive to NBTI degradation. For instance, $SiO_2$ film containing N (nitrogen) to a slight extent ($SiO_2$ (N)) may be used as insulating film having an effect of preventing $H_2O$ from diffusion. Such an $SiO_2$ (N) film can also reduce the rate at which $H_2$ is diffused from the upper layers to the lower layers.

A plurality of contact plugs 6 are formed in the insulating films 3, 4, 5 of the logic region. The contact plugs 6 are connected to the diffusion layer of the transistors T1 and other diffusion layers. Similarly, a plurality of contact plugs 6 are formed in the insulating films 3, 5 of the DRAM region and connected to the diffusion layer of the transistors T2 and other diffusion layers.

A multilayer wiring layer is formed on said insulating film 5 by using Cu wires and low-k film. The multilayer wiring layer is structurally identical in both the logic region and the DRAM region. More specifically, a first low-k film 7 is formed on the insulating film 5 and a cap film 8 is formed on the first low-k film 7. A plurality of first wiring layers 9 are formed in the first low-k film 7 and the cap film 8. The first wiring layers 9 are connected to the respective contact plugs 6 by way of barrier metal 9a that is, for example Ta.

An insulating film 10 made of SiN or SiC, for example, is formed on the first wiring layers 9 and the cap film 8. A second low-k film 11 is formed on the insulating film 10. A cap film 12 is then formed on the second low-k film 11. A plurality of via plugs 13 and second wiring layers 14 are formed in the insulating film 10, the second low-k film 11 and the cap film 12 by means of a dual Damascene method, for example. Barrier metal is arranged around the via plugs 13 and the second wiring layers 14. The via plugs 13 are connected to the respective first wiring layers 9.

Additionally, an insulating film 15 made of SiN or SiC, for example is formed on the second wiring layers 14 and the cap film 12. A third low-k film 16 is formed on the insulating film 15 and then a cap film 17 is formed on the third low-k film 16. A plurality of via plugs 18 and third wiring layers 19 are formed in the insulating film 15, the third low-k film 16 and the cap film 17 by means of a dual Damascene method, for example. Barrier metal is arranged around the via plugs 18 and the third wiring layers. 19. The via plugs 18 are connected to the respective second wiring layers 14.

An insulating film 20 is formed on the third wiring layers 19 and the cap film 17 in order to prevent Cu from diffusion. A CVD-SiO$_2$ film 21 is formed on the insulating film 20 and a passivation film 22 is formed on the CVD-SiO$_2$ film 21.

Now, the method of manufacturing a semiconductor device having the above described configuration will be described below.

FIGS. 2 through 9 illustrate the method of manufacturing a semiconductor device having a configuration as shown in FIG. 1. Note that, in FIGS. 2 through 9, the transistors T1 formed in the element forming layer 1 of the logic region and the memory cells MC formed in the element forming layer 2 of the DRAM region are omitted.

Figure 2:
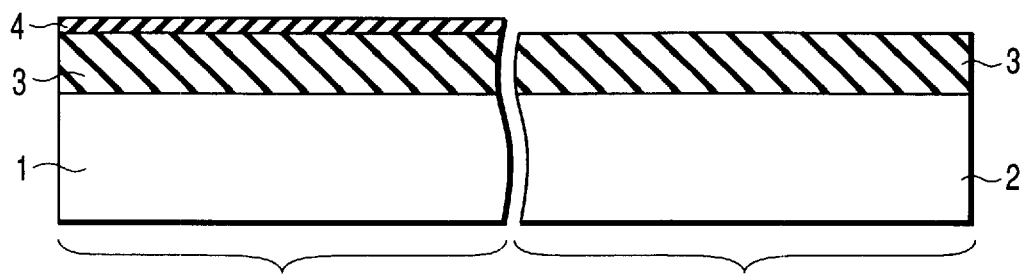
FIG. 2 is a cross sectional view of the embodiment of semiconductor device of FIG. 1, illustrating a manufacturing step thereof.

Referring firstly to FIG. 2, an insulating film 3 is deposited on the element forming layers 1, 2. The insulating film 3 is preferably a CVD film such as the BPSG or PSG film and shows an excellent step covering effect. Subsequently, a diffusion preventing film 4 for preventing H$_2$O from diffusion is deposited on the entire surface. The diffusion preventing film 4 is preferably an SiO$_2$ film containing N to a slight extent (SiO$_2$ (N) film). An SiO$_2$ film can be formed by deposition, using a plasma CVD method and SiH$_4$ and N$_2$O as main raw material gases. The N content of the SiO$_2$ (N) film is, for example, 5 to 15 atomic %, and is 8.8 to 9.8 atomic % preferably. The effect of preventing H$_2$O from diffusion is low and insufficient when the N content is less than 5 atomic %, whereas the dielectric constant of the SiO$_2$ (N) film becomes high to increase the wiring capacity when the N content is more than 15 atomic %.

Thereafter, the diffusion preventing film 4 is removed from the DRAM region although it is made to remain at least in the logic region. To do this, a resist mask (not shown) is formed on the diffusion preventing film 4 in the logic region by lithography, for example. Then, the diffusion preventing film 4 is etched out from the DRAM region by means of RIE (reactive ion etching), using the resist mask in the logic region. In this way, the diffusion preventing film 4 is formed in the logic region.

Figure 3:
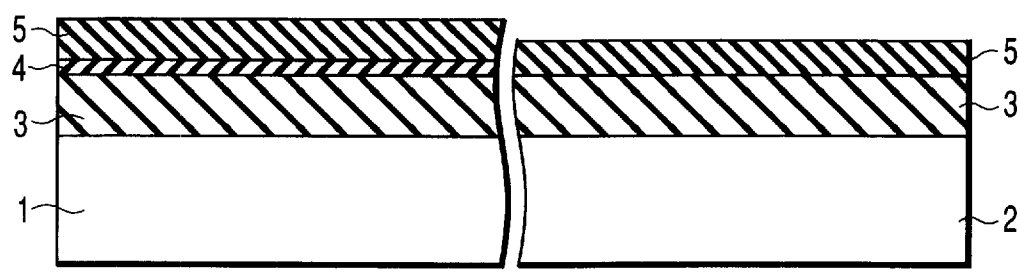
FIG. 3 is a cross sectional view, illustrating a manufacturing step subsequent to that of FIG. 2.

Subsequently, an insulating film 5 is formed on the entire surface by deposition as shown in FIG. 3.

Figure 4:
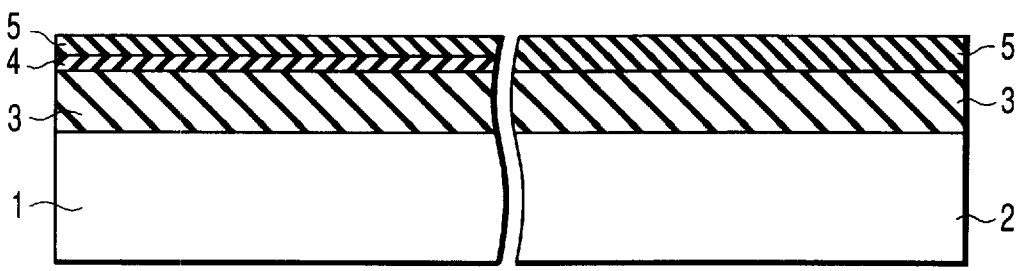
FIG. 4 is a cross sectional view, illustrating a manufacturing step subsequent to that of FIG. 3.

Then, as shown in FIG. 4, the insulating film 5 is planarized by CMP (chemical mechanical polishing), for example.

Thereafter, a plurality of contact holes (not shown) are formed in the insulating layers 3, 4, 5 on the element forming layer 1 and also in the insulating film layers 3, 5 on the element forming layer 2.

Then, tungsten (W) is deposited on the entire surface by means of CVD, for example, so that the contact holes are filled with tungsten.

Figure 5:
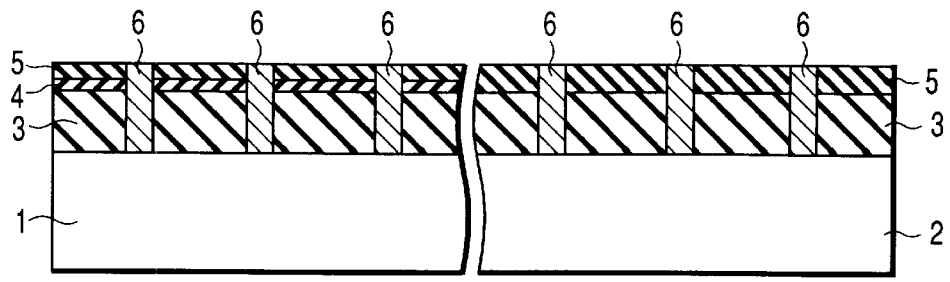
FIG. 5 is a cross sectional view, illustrating a manufacturing step subsequent to that of FIG. 4.

Subsequently, as shown in FIG. 5, the tungsten on the insulating film 5 is removed and the latter is planarized. Thus, contact plugs 6 are produced.

Figure 6:
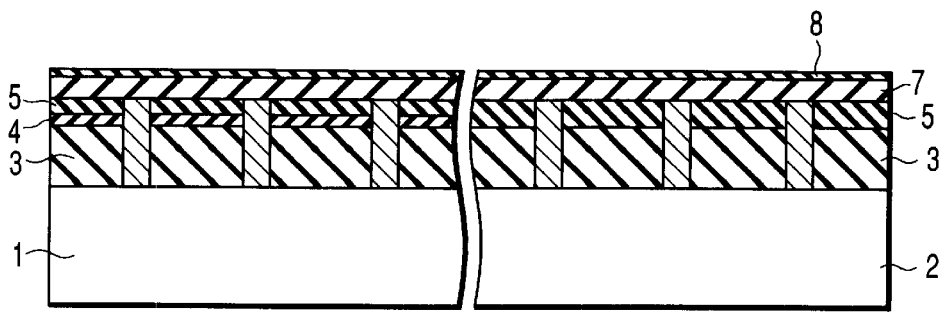
FIG. 6 is a cross sectional view, illustrating a manufacturing step subsequent to that of FIG. 5.

Thereafter, as shown in FIG. 6, a first low-k film 7 is formed on the entire surface as an insulating film for the first wiring layers and a cap film 8 is formed on the first low-k film 7 by deposition.

While a low dielectric constant film that is made of MSQ, HSQ or PAE, for example, may be used for the first low-k film 7, an MSQ film is used as an example in this embodiment. The MSQ film is formed by applying a liquid raw material onto the wafer and heating the wafer at about 400° C. to polymerize/condensate the raw material. As a result of polycondensation, an MSQ film that is a polymer is produced. Generally, a large amount of H$_2$O is produced during the polycondensation process. In this embodiment, the large amount of H$_2$O that is produced during the process of forming the first low-k film 7 is prevented from diffusing into the element forming layer 1 of the logic region by the diffusion preventing film 4.

The subsequent multilayer wiring forming process will be described only briefly because it is not essential to the embodiment. Firstly, the first low-k film 7 and the cap film 8 are subjected to an etching process to produce a plurality of grooves in the first low-k film 7 and the cap film 8. The grooves will be used for burying the respective first wiring layers 9 that are made of Cu.

Figure 7:
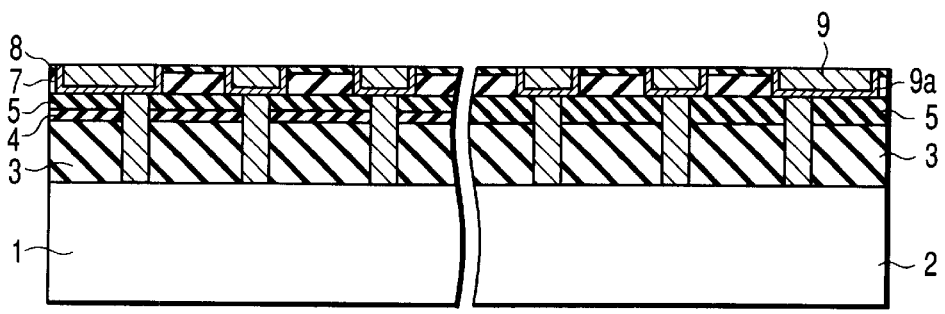
FIG. 7 is a cross sectional view, illustrating a manufacturing step subsequent to that of FIG. 6.

Then, as shown in FIG. 7, barrier metal 9a that may be Ta and Cu, for example, are buried in the grooves. The barrier metal 9a and the Cu found outside the grooves are removed by CMP for planarization. In this way, the first wiring layers 9 are produced.

Figure 8:
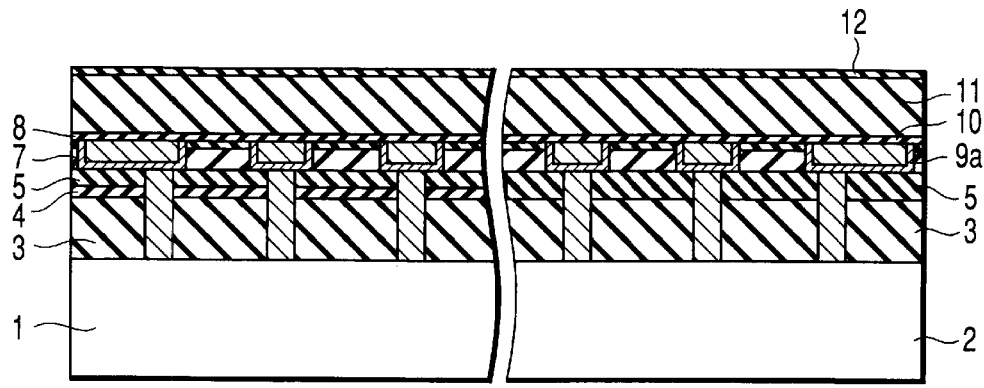
FIG. 8 is a cross sectional view, illustrating a manufacturing step subsequent to that of FIG. 7.

Thereafter, as shown in FIG. 8, an insulating film 10 made of SiN or SiCN, for example, is formed on the entire surface for the purpose of preventing Cu from diffusion. Then, another low-k film 11 and another cap film 12 are formed on the insulating film 10. The low-k film 11 and the cap film 12 operate as interlayer insulating films for the second wiring layers. Then, a plurality of grooves for burying respective second wiring layers 14 and via holes for electrically connecting said first wiring layers 9 and the second wiring layers 14 are formed in the interlayer insulating films.

Figure 9:
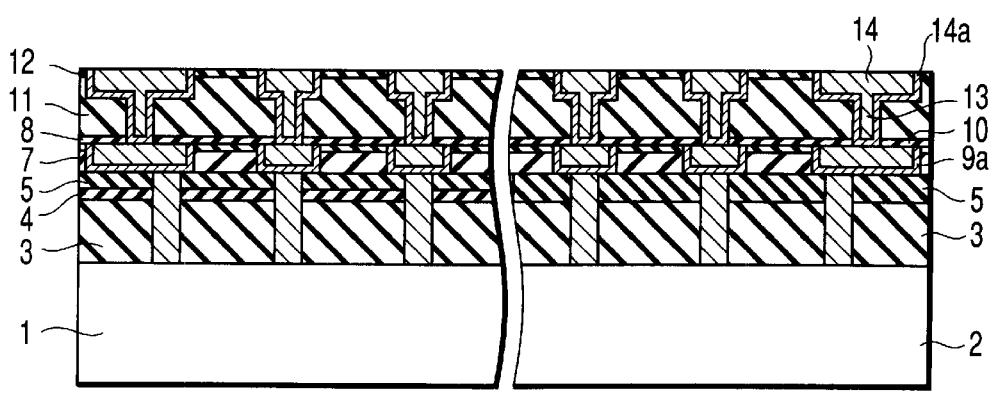
FIG. 9 is a cross sectional view, illustrating a manufacturing step subsequent to that of FIG. 8.

As shown in FIG. 9, barrier metal 14a that may be Ta and Cu, for example, are buried into the via holes and the grooves. Then, the Ta and the Cu outside the grooves are removed by CMP for planarization. In this way, the second wiring layers 14 and, the via plugs 13 are produced. Note that the diffusion preventing film 4 that operates in the step of forming the first wiring layers 9 as described above also operates for preventing H$_2$O that is produced in the step of forming the low-k film 11 from being diffused.

Then, third wiring layers 19 and via plugs 18 shown in FIG. 1 are formed by repeating the step employed for forming the second wiring layers 14. Thereafter, an insulating film 20 is formed on the entire surface as shown in FIG. 1 in order to prevent Cu from diffusion. A CVD-SiO$_2$ film 21 is formed on the insulating film 20 by deposition.

Subsequently, a sintering treatment is conducted in an H$_2$ containing atmosphere for the purpose of recovering from the charging damages that have been caused by the plasma treatments produced in the process of forming the multilayer wiring and improving the retention time of the DRAM. In this treatment, H$_2$ gas is supplied to the element forming layer of the DRAM region at a rate sufficient for improving the retention characteristics. On the other hand, the rate at which H$_2$ gas is supplied to the element forming layer 1 of the logic region that is sensitive to NBTI degradation is reduced by the diffusion preventing film 4. As a result, H$_2$ is prevented from being supplied excessively so that the possible NBTI degradation of the logic region is suppressed. Finally, a passivation SiN film 22 is formed on the CVD-SiO$_2$ film 21 to prevent H$_2$O in the atmosphere from penetrating into the element forming layers 1, 2.

Thus, a diffusion preventing film 4 is formed between the element forming layer 1 where transistors are formed and the interlayer insulating films including a low-k film in the logic region of the above described first embodiment for the purpose of preventing H$_2$O from diffusion. With this arrangement, the transistors in the logic region are protected against NBTI degradation that can be caused by H$_2$O.

On the other hand, no diffusion preventing film 4 is formed in the DRAM region for the purpose of preventing $H_2O$ from diffusion. With this arrangement, $H_2$ can be easily introduced for the sintering treatment. More specifically, $H_2$ can be introduced sufficiently into the element forming layer 2. As a result, it is possible to improve the retention characteristics of the memory cells.

In this embodiment, it is only necessary to provide a diffusion preventing film 4 at least between the gate insulating films (as indicated by reference numeral 23 in FIG. 1) of the transistors T1 formed in the logic circuit region and the interlayer insulating film arranged above the gate insulating films and showing a low dielectric constant.

While the above described semiconductor device according to the invention comprises three wiring layers. However, this embodiment is by no limited thereto and may alternatively have any number of wiring layers. In other words, this invention is effective for any multilayer wiring structures formed by a plurality of interlayer insulating films, provided that at least one or more than one of the interlayer insulating films are low-k films.

The appearance of $H_2O$ is not limited to the process of forming the low-k films. $H_2O$ may additionally be taken into the low-k films due to the hygroscopicity thereof typically during the multilayer wiring process and discharged in the subsequent heat treatments. Particularly, if porous low-k films are used, they are highly hygroscopic because of the large number of void areas they have. Then, if no $H_2O$ is produced during the film forming process, $H_2O$ may be discharged from the void areas. This embodiment is equally effective for preventing such $H_2O$ from diffusion.

2nd Embodiment

Figure 10:
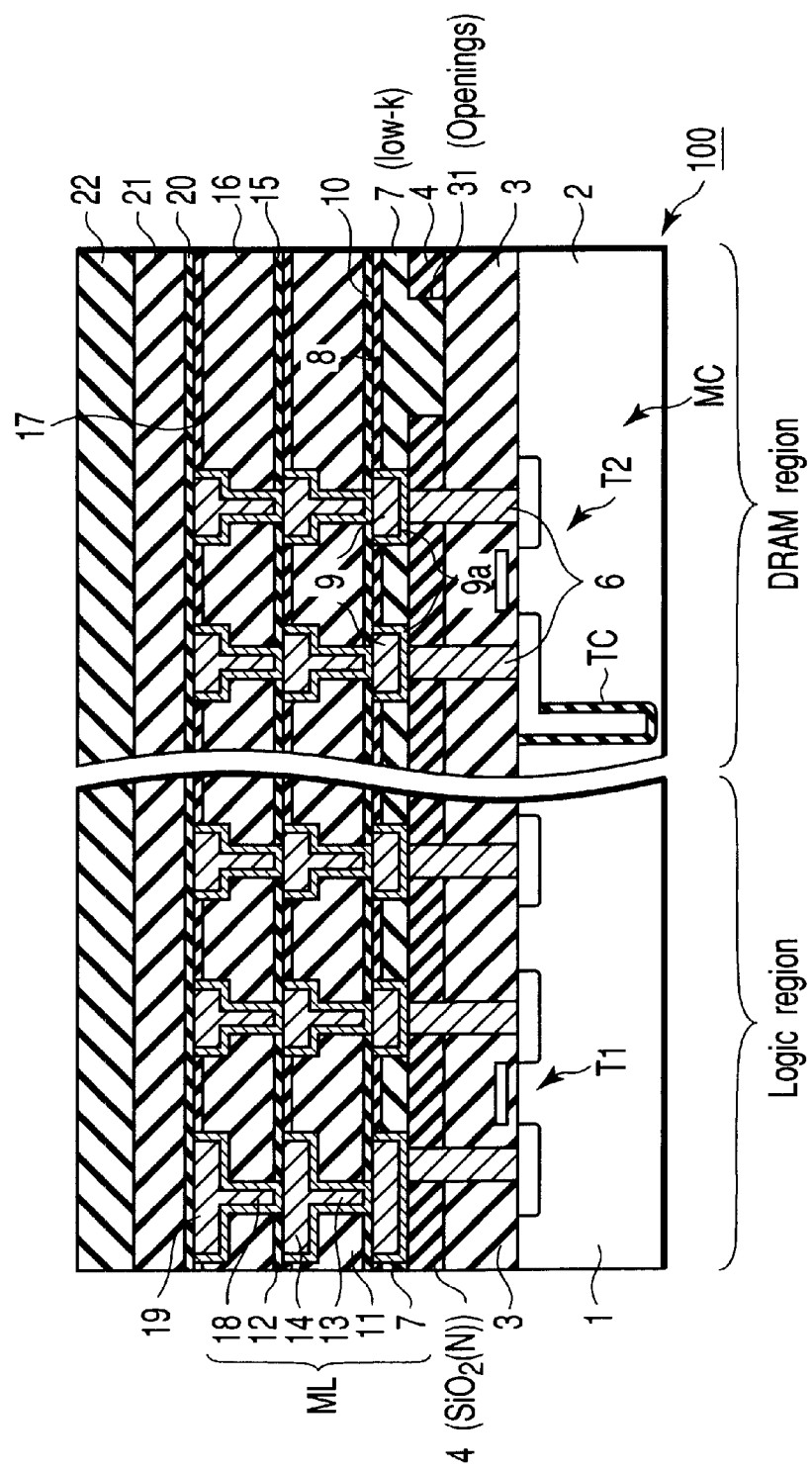
FIG. 10 is a schematic cross sectional view of the second embodiment of the present invention.

FIG. 10 is a schematic cross sectional view of the second embodiment of the semiconductor device according to the present invention. In FIG. 10, the components same as or similar to those of the embodiment of FIG. 1 are denoted respectively by the same reference symbols and only the components that are different from those of the first embodiment will be described below.

In the second embodiment, the insulating film layer arranged immediately under the multilayer wiring layer ML shows a structural difference between the logic region and the DRAM region. More specifically, a CVD insulating film 3 that is the BPSG or PSG film, for example, and shows an excellent covering effect is formed on the element forming layers 1, 2 in the logic region and the DRAM region, and a diffusion preventing film 4 having an effect of preventing $H_2O$ from diffusion is formed on the insulating film 3. A plurality of contact plugs 6 are formed in the insulating film 3 and the diffusion preventing film 4. The diffusion preventing film 4 can be formed by using a material same as the one used for the first embodiment. A first low-k film 7 is formed on the diffusion preventing film 4. Then, a cap film 8 is formed on the first low-k film 7. A plurality of first wiring layers 9 are formed in the inside of the first low-k film 7 and the cap film 8.

On the other hand, openings 31 are formed in the diffusion preventing film 4 in the DRAM region. The inside of each opening 31 is filled with the first low-k film 7.

Note that each opening 31 is formed in an area in the DRAM region where no first wiring layers 9 are found right above. Or, the opening 31 is formed in an area located between two first wiring layers 9 as shown in FIGS. 11A and 11B.

Figure 11A:
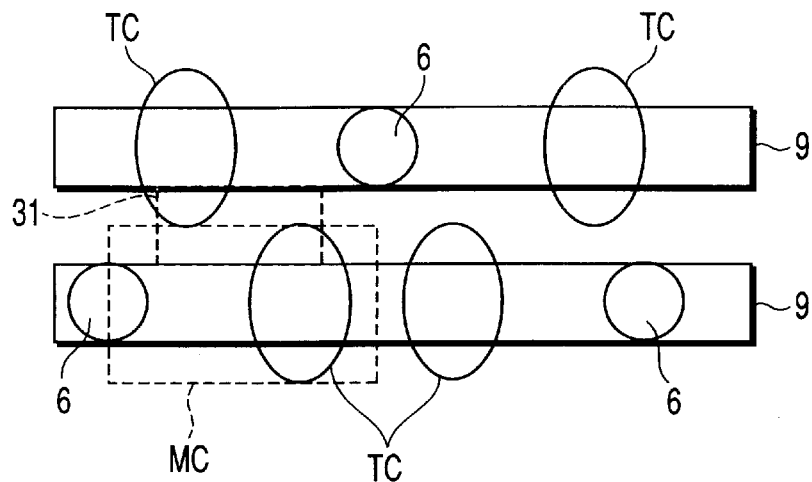
FIGS. 11A and 11B are schematic plan views, illustrating the positions of the openings in FIG. 10.

Referring now to FIG. 11A, assume that each of the memory cells MC have dimensions of 0.9×0.3 μm and the insulating film 3 has a film thickness of 600 nm between the bottom of the opening 31 and the element forming layer 2. Then, an opening is formed for every two memory cells. Note that an opening is formed in an area where no multilayer wiring layers are formed as shown in FIG. 10 or in an area located between two adjacent wiring layers of the first wiring layers 9 as shown in FIG. 11A.

Figure 11B:
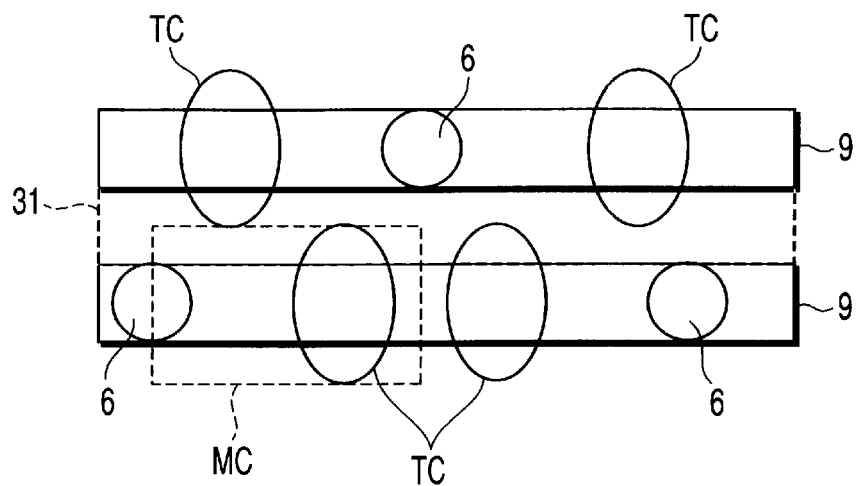

Still alternatively, an opening 31 may be formed between two adjacent first wiring layers 9 and along the entire length of the latter as shown in FIG. 11B. Then, an opening 31 may be formed for every three first wiring layers, for example.

However, the number of openings 31 is not limited to the above description and may be selected appropriately depending on the film thickness of at least an insulating film formed between the bottom of the openings 31 and the element forming layer 2 and/or the material of the insulating film.

With this arrangement, $H_2$ necessary for improving the retention characteristics can be supplied to the element forming layer 2 of the DRAM region by way of the openings 31.

Figure 12:
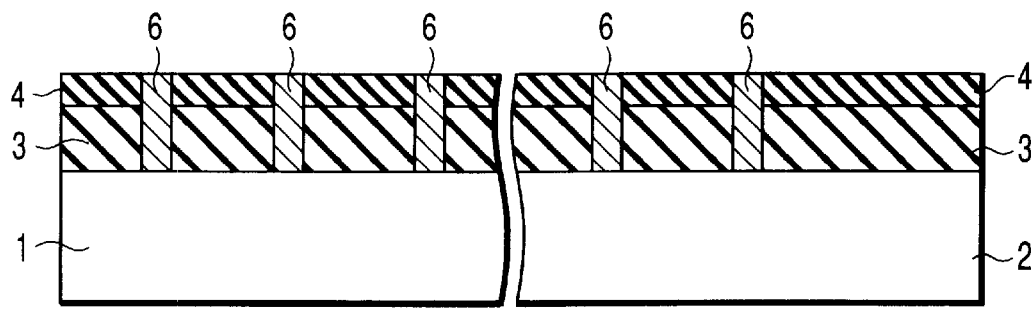
FIG. 12 is a cross sectional view of the embodiment of semiconductor device of FIG. 10, illustrating a manufacturing step thereof.
Figure 13:
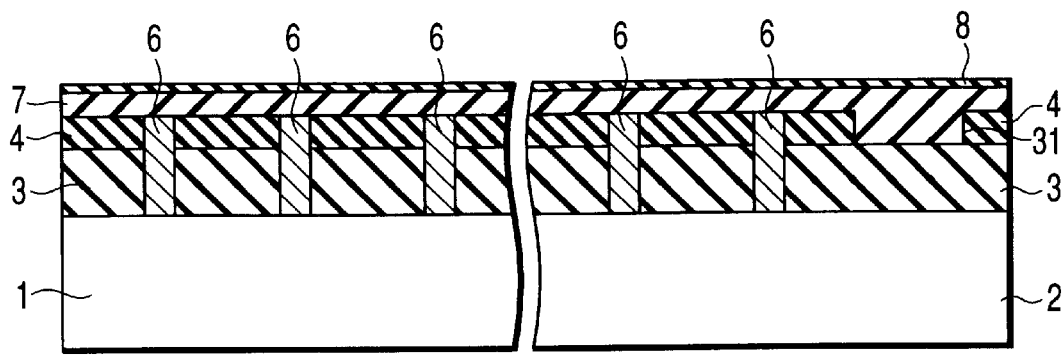
FIG. 13 is a cross sectional view, illustrating a manufacturing step subsequent to that of FIG. 12.
Figure 14:
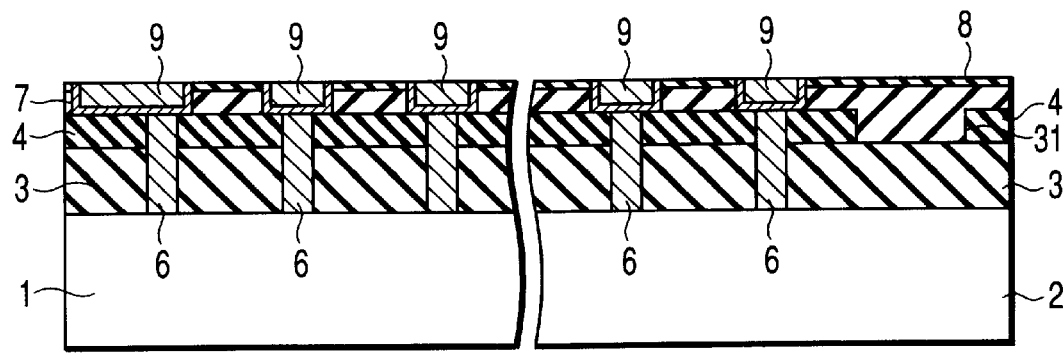
FIG. 14 is a cross sectional view, illustrating a manufacturing step subsequent to that of FIG. 13.

FIGS. 12 through 14 show the method of manufacturing the second embodiment of semiconductor device. In FIGS. 12 through 14, the transistors T1 formed in the element forming layer 1 of the logic region and the memory cells MC formed in the element forming layer 2 of the DRAM region are omitted.

As shown in FIG. 12, an insulating film 3 is deposited on the element forming layers 1, 2. The insulating film 3 is preferably a CVD film such as a BPSG or PSG film and shows an excellent step covering effect. Subsequently, a diffusion preventing film 4 for preventing $H_2O$ from diffusion is deposited on the entire surface. The diffusion preventing film 4 is preferably an $SiO_2$ film containing N to a slight extent ($SiO_2$ (N) film). An $SiO_2$ film can be formed by deposition, using a plasma CVD method and $SiH_4$ and $N_2O$ as main raw material gases. The N content of the $SiO_2$ (N) film is 5 to 15 atomic %, and is 8.8 to 9.8 atomic % preferably.

Thereafter, contact holes (not shown) are formed in the insulating film 3 and the diffusion preventing film 4. Then, tungsten (W) is deposited on the entire surface typically by means of CVD so that the contact holes are filled with tungsten. Subsequently, the tungsten on the insulating film 4 is removed and the latter is planarized. Thus, contact plugs 6 are produced.

Then, as shown in FIG. 13, the diffusion preventing film 4 is partly removed from the DRAM region, leaving it untouched in the logic region. To do this, a resist mask (not shown) is formed by lithography on the areas of the diffusion preventing film 4 that are to be left. Then, the unnecessary parts of diffusion preventing film 4 are etched out by means of RIE, using the resist mask, to produce openings 31 in the diffusion preventing film 4. After forming the openings 31 in the diffusion preventing film 4, a first low-k film 7 is deposited on the entire surface as insulating film to be used for the first wiring layer. As in the first embodiment, the MSQ film, for example, is used for the first low-k film 7 in this embodiment. A large amount of $H_2O$ is produced during the polycondensation process of the application type MSQ film. In this embodiment, the large amount of $H_2O$ that is produced during the process of forming the first low-k film 7 is prevented from diffusing into the transistors in the logic region by the diffusion preventing film 4. The diffusion preventing film 4 has openings 31 in the DRAM region. Therefore, $H_2$ that is produced in the above polycondensation process and in a subsequent sintering treatment can be supplied to the element forming layer 2 by way of the openings 31.

Thereafter, as shown in FIG. 14, a cap film 8 is formed on the first low-k film 7. Then, as in the case of the first embodiment, a plurality of first wiring layers 9 are formed in the first low-k film 7 and the cap film 8. The first wiring layers 9 are connected to the respective contact plugs 6.

Then, a multilayer wiring layer ML and other layers are formed sequentially by following the manufacturing steps same as those described above for the first embodiment to produce a finished semi-conductor device as shown in FIG. 10.

Thus, a diffusion preventing film 4 is formed between the element forming layer 1 and the first low-k film 7, where the first wiring layer 9 are produced, in the logic region of the above described second embodiment for the purpose of preventing $H_2O$ from diffusion. With this arrangement, the transistors in the logic region are protected against NBTI degradation that can be caused by $H_2O$ because $H_2O$ is prevented from penetrating there.

On the other hand, the diffusion preventing film 4 is provided with openings 31 in the DRAM region. With this arrangement, $H_2$ can be easily supplied to the element forming layer 2 by way of the openings 31 for the polycondensation process and also for the subsequent sintering treatment. As a result, it is possible to improve the retention characteristics of the memory cells.

An opening 31 is formed typically for every two memory cells or for every three first wiring layers 9. Thus, it is possible to provide a necessary and sufficient amount of $H_2$ to each memory cell. As a result, it is possible to improve the retention characteristics of the memory cell.

3rd Embodiment

Figure 15:
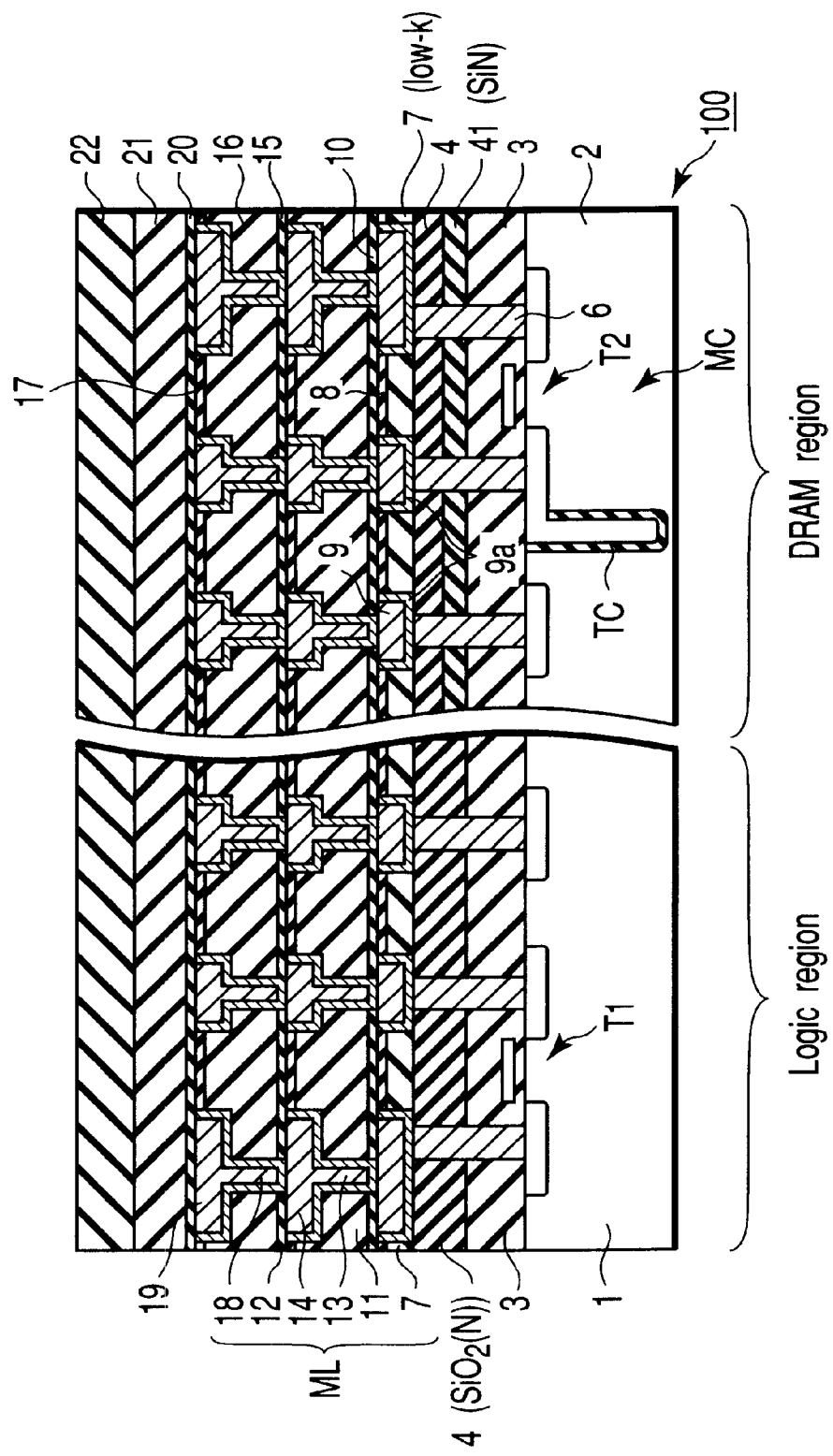
FIG. 15 is a schematic cross sectional view of the third embodiment of the present invention.

FIG. 15 is a schematic cross sectional view of the third embodiment of the semiconductor device according to the present invention. In FIG. 15, the components same as or similar to those of the embodiment of FIGS. 1 and 10 are denoted respectively by the same reference symbols and only the components that are different from those of the first embodiment will be described below.

In a semiconductor device comprising a logic circuit and a DRAM merged on a single chip shown in FIG. 15, the insulating film arranged immediately under the multilayer wiring layer ML shows a structural difference between the logic region and the DRAM region. More specifically, a CVD insulating film 3 that is the BPSG or PSG film, for example, and shows an excellent covering effect is formed on the element forming layers 1, 2 in the logic region and the DRAM region. In the DRAM region, an insulating film 41 is formed on the insulating film 3 as a source of supplying $H_2$ to the element forming layer 2. A silicon nitride (SiN) film formed by means of a plasma CVD method, for example, can suitably be used as an insulating film that operates for supplying $H_2$. A diffusion preventing film 4 having an effect of preventing $H_2O$ from diffusion is formed on the insulating film 41 and the insulating film 3 in said logic region. The diffusion preventing film 4 can be formed by using a material same as the one used for the first embodiment.

In the logic region, a plurality of contact plugs 6 are formed in the insulating film 3 and the diffusion preventing film 4. Similarly, in the DRAM region, a plurality of plugs 6 are formed in the insulating films 3, 41 and the diffusion preventing film 4.

A first low-k film 7 is formed on said diffusion preventing film 4. A cap film 8 is formed on the first low-k film 7. A plurality of first wiring layers 9 are formed in the inside of the first low-k film 7 and the cap film 8. The first wiring layers 9 are connected to the respective contact plugs 6.

Note that it is only necessary that contact plugs are formed in at least two or more than two insulating film layers in the DRAM region. In other words, the diffusion preventing film 4 may be omitted.

When the diffusion preventing film 4 is formed on the insulating film 41, it can suppress $H_2$ that is discharged from the insulating film 41 from diffusing toward the multilayer wiring layer ML and make $H_2$ effectively diffuse toward the element forming layer 2.

FIGS. 16 through 20 show the method of manufacturing the third embodiment of semiconductor device shown in FIG. 15. In FIGS. 15 through 19, the transistors T1 formed in the element forming layer 1 of the logic region and the memory cells MC formed in the element forming layer 2 of the DRAM region are omitted.

Figure 16:
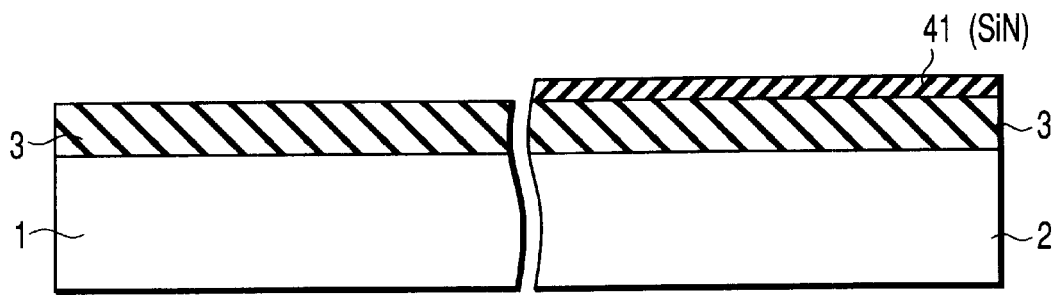
FIG. 16 is a cross sectional view of the embodiment of FIG. 15, illustrating a manufacturing step thereof.

As shown in FIG. 16, an insulating film 3 is deposited on the element forming layers 1, 2. The insulating film 3 is preferably a CVD film such as the BPSG or PSG film and shows an excellent step covering effect. Thereafter, an insulating film (SiN) 41 that operates as $H_2$ supply source is formed on the entire surface of the insulating film 3 by plasma CVD, for example. The insulating film 41 contains $H_2$ to a large extent. Then, the insulating film 41 is removed from the logic region but left to remain in the DRAM. To do this, a resist mask (not shown) is formed on the insulating film 41 in the DRAM region by lithography, for example. Then, the insulating film 41 is etched out from the logic region by means of RIE, using the resist mask in the DRAM region.

Figure 17:
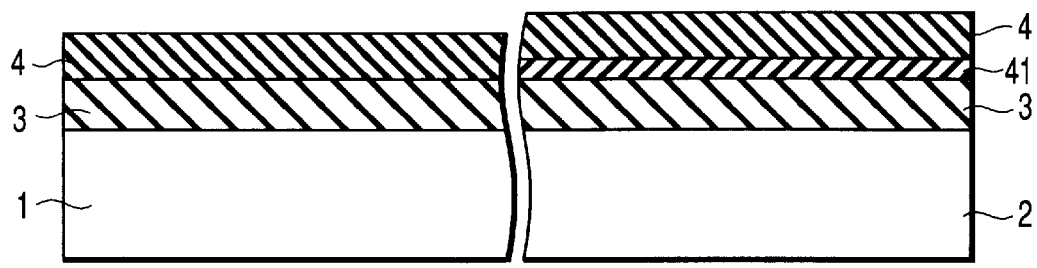
FIG. 17 is a cross sectional view, illustrating a manufacturing step subsequent to that of FIG. 16.

Subsequently, as shown in FIG. 17, a diffusion preventing film 4 is formed by deposition on the entire surface in order to prevent $H_2O$ from diffusion by a film forming method same as the one described above for the first and second embodiments.

Figure 18:
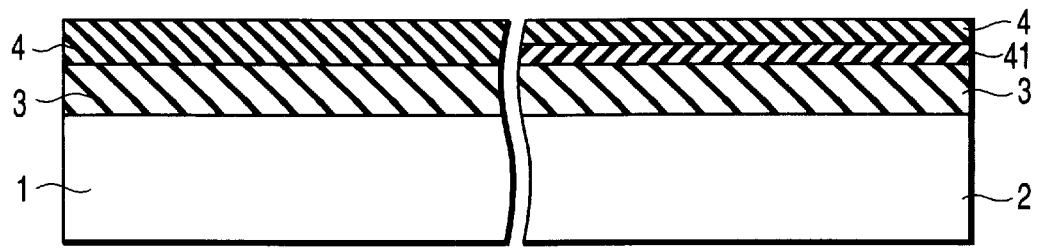
FIG. 18 is a cross sectional view, illustrating a manufacturing step subsequent to that of FIG. 17.

Then, as shown in FIG. 18, the diffusion preventing film 4 is planarized by CMP.

Figure 19:
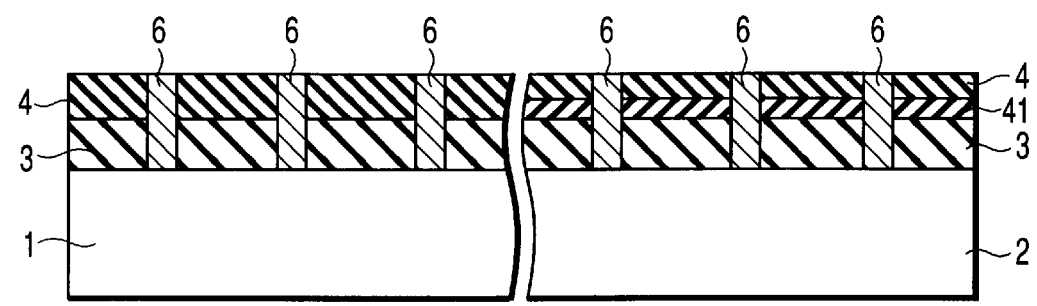
FIG. 19 is a cross sectional view, illustrating a manufacturing step subsequent to that of FIG. 18.
Figure 20:
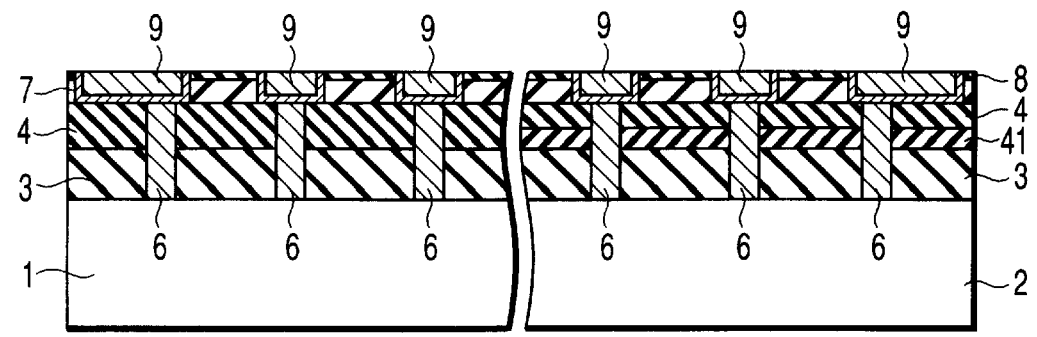
FIG. 20 is a cross sectional view, illustrating a manufacturing step subsequent to that of FIG. 19.

Then, as shown in FIG. 19, a plurality of contact holes are formed in the plurality of insulating film layers on the element forming layer. Thereafter, tungsten (W) is deposited on the entire surface by means of CVD, for example, so that the contact holes are filled with tungsten. Subsequently, the tungsten on the insulating film 4 is removed and the latter is planarized. Thus, contact plugs 6 are produced.

Then, a first low-k film 7 is deposited on the entire surface as insulating film to be used for the first wiring layer. As in the first and second embodiments, the MSQ film, for example is used for the first low-k film 7 in this embodiment. A large amount of $H_2O$ is produced during the polycondensation process of the MSQ film. In this embodiment, the $H_2O$ that is produced during the process of forming the first low-k film 7 is prevented from diffusing into the transistors in the logic region by the diffusion preventing film 4. Thereafter, a cap film 8 is formed on the first low-k film 7. Then, a plurality of first wiring layers 9 are formed in the first low-k film and the cap film 8 as in the first and second embodiments. The first wiring layers are connected to the respective contact plugs 6.

Then, the multilayer wiring layer ML and other layers are formed sequentially by following the manufacturing steps same as those described above for the first and second embodiments to produce a finished semiconductor device as shown in FIG. 15.

Thus, the diffusion preventing film 4 is formed between the element forming layer 1 and the first low-k film 7, where the first wiring layers 9 are produced, in the logic region of the above described third embodiment for the purpose of preventing $H_2O$ from diffusion. With this arrangement, the transistors in the logic region are protected against NBTI degradation that can be caused by $H_2O$ because $H_2O$ is prevented from penetrating there.

On the other hand, the insulating film 41 is formed between the element forming layer 2 and the first low-k film 7 where the first wiring layers 9 are formed so as to operates as $H_2$ supply source. With this arrangement, it is possible to provide a necessary and sufficient amount of $H_2$ to each memory cell in the $H_2$ sintering treatment that is the final step of forming the multilayer wiring layer. As a result, it is possible to improve the retention characteristics of the memory cells.

Additionally, as a result of forming a diffusion preventing film 4 on the insulating film 41 for the purpose of preventing $H_2O$ from diffusion, $H_2$ gas can be supplied to the memory cells in the DRAM region at a rate sufficient for improving the retention time of the memory cells in the heat treatment step of the multilayer wiring process.

A logic circuit and a DRAM are merged on a single chip in each of the above described first through third embodiments. However, each of the first through third embodiments can be applied to a semiconductor device comprising a logic circuit and not a DRAM but a memory of some other type whose retention characteristics can be improved by introducing $H_2$.

While Cu is used as the material of the wiring layers in the first through third embodiment, the present invention is by no means limited thereto. A similar effect can be achieved by using Al for the wiring layers.

Any of the features of the first through third embodiments may be appropriately combined for the purpose of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a logic region formed in said semiconductor substrate and including an element forming layer;
   a memory region formed in said semiconductor substrate and including an element forming layer;
   a multilayer wiring layer formed above each of said logic region and said memory region; and
   a diffusion preventing film formed at least between said multilayer wiring layer in said logic region and said element forming layer in said logic region, said diffusion preventing film being adapted to prevent $H_2O$ from diffusing into said logic region.

2. The device according to claim 1, said multilayer wiring layer comprising:
   an interlayer insulating film having a dielectric constant lower than that of silicon oxide film; and
   wires arranged in said interlayer insulating film.

3. The device according to claim 1, wherein said diffusion preventing film is arranged at least between the gate insulating films of the transistors formed in said logic region and said low dielectric constant interlayer insulating film arranged above them.

4. The device according to claim 1, wherein said diffusion preventing film is a silicon oxide film containing nitrogen.

5. The device according to claim 4, wherein the nitrogen content of said silicon oxide film is 8.8 to 9.8 atomic %.

6. The device according to claim 4, wherein the nitrogen content of said silicon oxide film is 5 to 15 atomic %.

7. A semiconductor device comprising:
   a semiconductor substrate;
   a logic region formed in said semiconductor substrate and including an element forming layer;
   a memory region formed in said semiconductor substrate and including an element forming layer;
   a multilayer wiring layer formed above said logic region and said memory region;
   a diffusion preventing film formed between said element forming layers of said logic region and said memory region and said multilayer wiring layer, said diffusion preventing film being adapted to prevent $H_2O$ from diffusion; and
   openings formed in said diffusion preventing film of said memory region.

8. The device according to claim 7, wherein said openings are formed among a plurality of wiring layers arranged in one of the layers of said multilayer wiring layer and each of said openings is arranged for a plurality of memory cells formed in said memory region.

9. The device according to claim 7, wherein each of said openings are formed between two adjacent wiring layers arranged in one of the layers of said multilayer wiring layer and arranged for a plurality of wires.

10. The device according to claim 7, said multilayer wiring layer comprising:
    an interlayer insulating film having a dielectric constant lower than that of silicon oxide film; and
    wires arranged in said interlayer insulating film.

11. The device according to claim 7, wherein said diffusion preventing film is a silicon oxide film containing nitrogen.

12. The device according to claim 10, wherein the nitrogen content of said silicon oxide film is 8.8 to 9.8 atomic %.

13. The device according to claim 10, wherein the nitrogen content of said silicon oxide film is 5 to 15 atomic %.

14. A semiconductor device comprising:
    a semiconductor substrate;
    a logic region formed in said semiconductor substrate and including an element forming layer;
    a memory region formed in said semiconductor substrate and including an element forming layer;
    a multilayer wiring layer formed above said logic region and said memory region;
    a first diffusion preventing film formed between said logic region and said multilayer wiring layer, said first diffusion preventing film being adapted to prevent $H_2O$ from diffusion; and
    an insulating film formed between said memory region and said multilayer wiring layer and adapted to operate as $H_2$ supply source.

15. The device according to claim 14, further comprising:
    a second diffusion preventing film formed between said insulating film and said multilayer wiring layer.

16. The device according to claim 14, said multilayer wiring layer comprising:

an interlayer insulating film having a dielectric constant lower than that of silicon oxide film; and wires arranged in said interlayer insulating film.

17. The device according to claim 14, wherein said first and second diffusion preventing film are silicon oxide films containing nitrogen.

18. The device according to claim 17, wherein the nitrogen content of said silicon oxide film is 8.8 to 9.8 atomic %.

19. The device according to claim 17, wherein the nitrogen content of said silicon oxide film is 5 to 15 atomic %.

* * * * *